US011474140B2

(12) United States Patent
Ha et al.

(10) Patent No.: US 11,474,140 B2
(45) Date of Patent: Oct. 18, 2022

(54) RELATING TO LOCATING FAULTS IN POWER TRANSMISSION CONDUITS

(71) Applicant: GENERAL ELECTRIC TECHNOLOGY GMBH, Baden (CH)

(72) Inventors: Hengxu Ha, Stafford (GB); Sankara Sri Gopola Krishna Murthi, Stafford (GB)

(73) Assignee: General Electric Technology Gmbh, Baden (CH)

( * ) Notice: Subject to any disclaimer, the term of this patent is extended or adjusted under 35 U.S.C. 154(b) by 243 days.

(21) Appl. No.: 16/325,982

(22) PCT Filed: Aug. 8, 2017

(86) PCT No.: PCT/EP2017/070080
§ 371 (c)(1),
(2) Date: Feb. 15, 2019

(87) PCT Pub. No.: WO2018/033436
PCT Pub. Date: Feb. 22, 2018

(65) Prior Publication Data
US 2019/0178929 A1 Jun. 13, 2019

(30) Foreign Application Priority Data

Aug. 17, 2016 (EP) .................................. 16184529

(51) Int. Cl.
*G01R 31/08* (2020.01)
*G01R 19/25* (2006.01)
*G01R 31/11* (2006.01)

(52) U.S. Cl.
CPC ....... *G01R 31/088* (2013.01); *G01R 19/2509* (2013.01); *G01R 31/083* (2013.01);
(Continued)

(58) Field of Classification Search
CPC ...... G01R 31/50; G01R 31/52; G01R 31/085; G01R 31/086; G01R 31/3275;
(Continued)

(56) References Cited

U.S. PATENT DOCUMENTS 4,695,825 A * 9/1987 Bloy ..................... H03M 1/069
341/118
2002/0169585 A1* 11/2002 Jones ..................... H04B 3/493
702/189
(Continued)

FOREIGN PATENT DOCUMENTS

CN 101106271 A 1/2008
CN 103969554 A 8/2014
(Continued)

OTHER PUBLICATIONS

European Search Report and Written Opinion dated Jan. 31, 2017 which was issued in connection with EP 16184529.2 which was filed on Aug. 17, 2016.
(Continued)

*Primary Examiner* — Michael J Dalbo
(74) *Attorney, Agent, or Firm* — Eversheds Sutherland (US) LLP

(57) ABSTRACT

In the field of fault location within a power transmission network, a method of determining a fault location in a power transmission conduit includes: (a) sampling at an original sampling frequency a signal propagating through the power transmission conduit to establish a first data set including a plurality of sampled signal characteristics; (b) interpolating the first data set to establish a second data set including an increased number of signal characteristics whereby the second data set has an equivalent sampling frequency higher than the original sampling frequency; (c) identifying a fault wave signal within the second data set; and (d) utilising the propagation characteristics of the fault wave signal to deter-
(Continued)

mine the origin of the fault wave signal within the power transmission conduit.

8 Claims, 2 Drawing Sheets

(52) U.S. Cl.
CPC ........ *G01R 31/085* (2013.01); *G01R 19/2506* (2013.01); *G01R 31/11* (2013.01)

(58) Field of Classification Search
CPC .... G01R 19/2513; H02H 7/261; H02H 3/302; H02H 3/305; H02H 3/307; H02H 7/265
See application file for complete search history.

(56) References Cited

U.S. PATENT DOCUMENTS

| | | | |
|---|---|---|---|
| 2005/0109020 A1 | 5/2005 | Ichise et al. | |
| 2009/0315565 A1* | 12/2009 | Wyar | G01R 31/11 324/533 |
| 2012/0098672 A1* | 4/2012 | Restrepo | H02H 3/027 340/815.45 |
| 2013/0096854 A1* | 4/2013 | Schweitzer, III | G01R 31/085 702/59 |
| 2013/0245440 A1* | 9/2013 | Fokkenrood | A61B 8/12 600/437 |
| 2013/0332095 A1* | 12/2013 | Valtari | G01R 21/133 702/60 |
| 2015/0081236 A1* | 3/2015 | Schweitzer, III | G01R 31/085 702/59 |
| 2015/0316593 A1* | 11/2015 | Oda | G01R 19/2513 702/60 |
| 2017/0356965 A1* | 12/2017 | Guzman-Casillas | G01R 31/085 |

FOREIGN PATENT DOCUMENTS

| | | |
|---|---|---|
| CN | 102998593 B | 4/2015 |
| CN | 103293449 B | 4/2015 |
| CN | 105492915 B | 4/2018 |
| CN | 105474022 B | 5/2018 |
| EP | 0882993 A2 | 12/1998 |
| EP | 2490031 A1 | 8/2012 |
| JP | 4392232 B2 * | 12/2009 |
| WO | 2005109020 A2 | 11/2005 |
| WO | 2015039114 A1 | 3/2015 |

OTHER PUBLICATIONS

International Search Report and Written Opinion dated Nov. 3, 2017 which was issued in connection with PCTPCT/EP2017/070080 which was filed on Aug. 8, 2017.
Office Action issued in Chinese Patent Application No. 201780050242.3, dated Apr. 28, 2021, 11 pages.

* cited by examiner

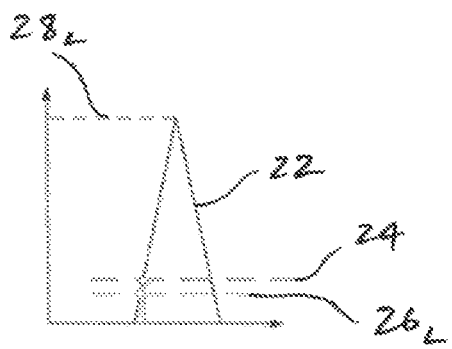
Figure 3
Figure 4A
Figure 4B

RELATING TO LOCATING FAULTS IN POWER TRANSMISSION CONDUITS

BACKGROUND OF THE DISCLOSURE

This invention relates to a method of determining a fault location in a power transmission conduit.

The accurate location of faults within a power transmission network saves time and resources for network operators.

Line searches, i.e. a visual inspection of power transmission conduits, are costly and can be inconclusive. In addition, in the case of an underground cable they may not even be practicable.

Two other methods of fault location, i.e. a so-called impedance based method and a so-called travelling wave based method, tend therefore to be used instead. The travelling wave based method is generally considered to be more accurate.

BRIEF SUMMARY

According to a first embodiment of the invention there is provided a method of determining a fault location in a power transmission conduit comprising the steps of:
 (a) sampling at an original sampling frequency a signal propagating through the power transmission conduit to establish a first data set including a plurality of sampled signal characteristics;
 (b) interpolating the first data set to establish a second data set including an increased number of signal characteristics whereby the second data set has an equivalent sampling frequency higher than the original sampling frequency;
 (c) identifying a fault wave signal within the second data set; and
 (d) utilising the propagation characteristics of the fault wave signal to determine the origin of the fault wave signal within the power transmission conduit.

The ability to sample a signal travelling through a power transmission conduit at an original sampling frequency that is lower than the equivalent sampling frequency of the second data set reduces the cost of the sampling equipment required, and so helps to reduce the overall cost of the associated fault locator equipment.

Meanwhile the step of interpolating the first data set to establish a second data set with an equivalent sampling frequency higher than the original sampling frequency, i.e. a second data set with a higher resolution than the first data set, helps to ensure that the invention is able to determine a fault location with the same degree of accuracy as more expensive fault locator assemblies which are configured to sample at much higher sampling frequencies.

Step (a) of sampling at an original sampling frequency a signal propagating through the power transmission conduit includes filtering the first data set.

Optionally filtering the first data set includes applying a band pass filter to one of:
(a) the signal; or
(b) the first data set.

Such filtering helps to focus the first data set on the likely signal characteristics of a fault wave signal which arise when a fault occurs in the power transmission conduit.

The band pass filter may have a lower frequency limit of between 2 kHz and 10 kHz.

Such a lower frequency limit assists in removing low frequency components from the first data set and so helps to ensure accurate and efficient capture of fault wave signals.

The band pass filter may have an upper frequency limit not more than half the original sampling frequency.

Having such an upper frequency limit helps to prevent aliasing, i.e. distortion, of the signal represented by the first data set.

In a method of the invention in which step (a) includes sampling at an original sampling frequency each of a respective phase signal propagating through a corresponding one of a plurality of phase conduits of a power transmission conduit configured to transfer power within a multi-phase power transmission network to establish a plurality of individual phase data sets including a plurality of sample phase signal characteristics, the method thereafter includes converting the plurality of individual phase data sets into a single first data set indicative of the said individual phase data sets.

Optionally converting the plurality of individual phase data sets into a single first data set includes converting the phase data sets into a mode domain.

The manner in which conversion into the mode domain occurs is dependent on the nature of a fault arising with respect to one or more of the phase conduits.

The foregoing steps of the method of the invention helpfully assist in applying the method of the invention to a power transmission conduit within a multi-phase power transmission network.

In another embodiment of the method of the invention step (b) of interpolating the first data set to establish a second data set including an increased number of signal characteristics is such that the second data set has an equivalent sampling frequency that is at least five times higher than the original sampling frequency.

Such interpolation of the first data set helps to ensure a worthwhile reduction in the sampling capability needed by the or each equipment item carrying out sampling of a signal, and hence helps to ensure a commensurate reduction in the capital equipment cost of the or each said equipment item.

Step (c) of identifying a fault wave signal within the second data set may include identifying when a signal characteristic within the second data set exceeds a fault threshold.

Such a step is readily repeatable and reliably identifies a fault wave signal.

Optionally identifying when a signal characteristic within the second data set exceeds a fault threshold includes establishing the time at which the fault threshold is exceeded.

The foregoing step usefully establishes data that permits the subsequent determination of a distance identifying the location of a fault within the power transmission conduit.

In a still further embodiment of the invention step (d) of utilising the propagation characteristics of the fault wave signal to determine the origin of the fault wave signal within the power transmission conduit includes:

(a) carrying out steps (a) to (c) at each of a local end of the transmission conduit and a remote end of the transmission conduit to thereby establish the respective time at which a corresponding fault threshold is exceeded at each of the said local and remote ends; and thereafter;

(b) determining the distance of the fault from the local end according to:

$$m = \frac{1}{2} * [L + (t_L - t_R) * v]$$

where,
m is the distance of the fault from the local end;
L is the total length of the power transmission conduit;
$t_L$ is the time at which a fault threshold is exceeded at the local end;
$t_R$ is the time at which a fault threshold is exceeded at the remote end; and
v is the propagation velocity of the fault wave signal.

Such steps desirably make use of available data to accurately and reliably determine the distance of the fault from the local end of the power transmission conduit, i.e. the fault location within the power transmission conduit.

BRIEF DESCRIPTION OF THE DRAWINGS

There now follows a brief description of the embodiments of the invention, by way of non-limiting examples, with reference being made to the following figures in which:
FIG. 3 illustrates the impact, within the method illustrated in FIG. 2, of respective iterations on a first data set;
and
FIGS. 4A and 4B illustrate schematically the step, within the method illustrated in FIG. 2, of identifying when a signal characteristic exceeds a fault threshold.

DETAILED DESCRIPTION

Figure 1:
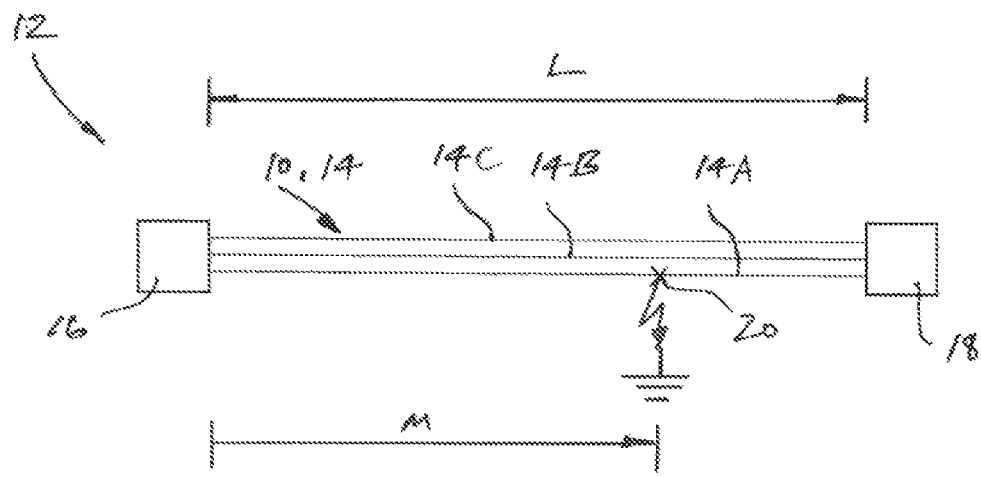
FIG. 1 shows a schematic view of a power transmission conduit.

An example power transmission conduit 10, which forms a part of a multi-phase power transmission network 12, is illustrated schematically in FIG. 1.
In the example shown, the power transmission conduit 10 is an overhead transmission line 14 which includes three phase conduits, i.e. three phase lines 14A, 14B, 14C, each of which corresponds to a respective phase A, B, C of the power transmission network 12.
The method of the invention is equally applicable to power transmission conduits which take the form of, e.g. an underground transmission cable, and/or include fewer than or more than three phase conduits.
The power transmission conduit 10, i.e. the respective phase lines 14A, 14B, 14C extend between a local end 16 and a remote end 18.
A method, according to a first embodiment of the invention, of determining a fault location within the example power transmission conduit 10, i.e. the location of a fault 20 with respect to one or more of the respective phase lines 14A, 14B, 14C, includes, as illustrated schematically in FIG. 2, the principle steps of:
(a) sampling at an original sampling frequency a signal propagating through the power transmission conduit 10 to establish a first data set which includes a plurality of sampled signal characteristics;
(b) interpolating the first data set to establish a second data set that includes an increased number of signal characteristics whereby the second data set has an equivalent sampling frequency which is higher than the original sampling frequency;
(c) identifying a fault wave signal within the second data set; and
(d) utilising the propagation characteristics of the fault wave signal to determine the origin of the fault wave signal within the power transmission conduit 10.

More particularly, sampling a signal propagating through the power transmission conduit 10 includes, first of all measuring a respective current signal $i_A(t)$, $i_B(t)$, $i_C(t)$ within each phase line 14A, 14B, 14C. Such measuring may, for example, be carried out by a current transformer (not shown).

In other embodiment of the invention, sampling a signal propagating through the power transmission conduit may instead include measuring one or more respective voltage signals within the or each phase line, conduit or cable.

Figure 2:
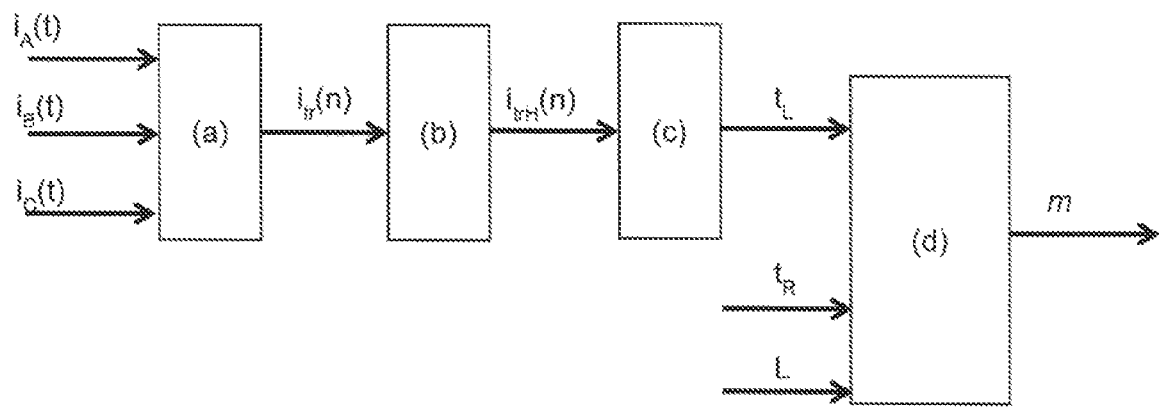
FIG. 2 illustrates schematically principle steps in a method of determining a fault location, in the power transmission conduit shown in FIG. 1, according to a first embodiment of the invention.

Returning to the embodiment of the method illustrated schematically in FIG. 2, the sampling step (a) also includes applying a band pass filter to each current signal $i_A(t)$, $i_B(t)$, $i_C(t)$.

The band pass filter has a lower frequency limit of 10 kHz, although in other embodiments of the invention the lower frequency limit may lie between 2 kHz and 10 kHz.

The upper frequency of the band pass filter is not more than half the original sampling frequency. The original sampling frequency is not less than 96 kHz and by way of example is, in the embodiment described, 100 kHz although it may vary in other embodiments of the invention.

More still, in the embodiment of the invention described herein above, the upper frequency of the band pass filter is one quarter of the original sampling frequency, i.e. is 25 kHz.

Following such filtering of the respective current signals $i_A(t)$, $i_B(t)$, $i_C(t)$ an analogue to digital sampling module obtains samples of the said current signals $i_A(t)$, $i_B(t)$, $i_C(t)$ at the original sampling frequency, e.g. 100 kHz, to establish three individual corresponding phase data sets iA, iB, iC, each of which includes a plurality of sample phase current signal characteristics.

Step (a) of the method then further includes converting the individual phase data sets iA, iB, iC into a single first data set $i_{tr}(n)$ which is indicative of the said individual phase data sets iA, iB, iC.

Such conversion into a single first data set $i_{tr}(n)$ includes converting the phase data sets iA, iB, iC into a mode domain, and more particularly the manner in which the conversion takes place is dependent on the nature of fault 20 arising with respect to one or more of the phase conduits, i.e. with respect to one or more of the phase lines 14A, 14B, 14C.

If the fault 20 arises:
(a) between the phase A phase line 14A and ground (as illustrated by way of example in FIG. 1) then the single first data set $i_{tr}(n)$ is given by $i_{tr}(n)=2*iA-iB-iC;$ (b) between the phase B phase line 14B and ground then the single first data set $i_{tr}(n)$ is given by $i_{tr}(n)=2*iB-iC-iA;$ (c) between the phase C phase line 14C and ground then the single first data set $i_{tr}(n)$ is given by $i_{tr}(n)=2*iC-iA-iB;$ (d) between the phase A phase line 14A and the phase B phase line 14B (whether grounded or ungrounded) then the single first data set i$_{tr}$(n) is given by $$i_{tr}(n) = iA - iB;$$

(e) between the phase B phase line 14B and the phase C phase line 14C (whether grounded or ungrounded) then the single first data set i$_{tr}$(n) is given by $$i_{tr}(n) = iB - iC;$$

(f) between the phase C phase line 14C and the phase A phase line 14A (whether grounded or ungrounded) then the single first data set i$_{tr}$(n) is given by $$i_{tr}(n) = iC - iA; \text{ and}$$

(g) between all phase lines 14A, 14B, 14C (whether grounded or ungrounded) then the single first data set i$_{tr}$(n) is given by $$i_{tr}(n) = 2*iA - iB - iC;$$

In other embodiments of the method of the invention, the first data set, whether converted from a plurality of individual phase data sets or not, may instead be filtered by first of all sampling a signal, e.g. using a current or voltage transformer as appropriate, and then applying a band pass filter to the sampled signal characteristics.

Following step (a) as described hereinabove, step (b) of the first embodiment method of the invention includes interpolating the first data set i$_{tr}$(n) to establish a second data set i$_{trH}$(n) which includes an increased number of signal characteristics such that the second data set i$_{trH}$(n) has an equivalent sampling frequency that is at least five times higher than the original sampling frequency.

By way of example, the first data set i$_{tr}$(n) is interpolated so that it has an equivalent sampling frequency of 1.6 MHz which is sixteen times higher than the original sampling frequency of 100 Hz.

One way in which the first data set i$_{tr}$(n) may be interpolated, although other techniques are also possible within the scope of the invention, is to use M-order spline interpolation.

Such interpolation includes selecting a proper order for the spline function, and then calculating coefficients for interpolation using the following formula, $$p(k) = \frac{1}{2^{M-1}} C_M^k$$

where,
(a) M=1, 2, 3 or 4, . . . ; and $$C_M^k = \frac{M!}{k!(M-k)!}$$

For example, if we select M=5, then the coefficients for interpolation are:
(a) p(0)=1/16;
(b) p(1)=5/16;
(c) p(2)=10/16;
(d) p(3)=10/16;
(e) p(4)=5/16; and
(f) p(5)=1/16.

Once the coefficients for interpolation have been established, interpolation is carried out according to $$f(n) = \sum_{k=-\infty}^{\infty} f(k) * p(n - 2k)$$

In other words, a convolution is operated on the first data set i$_{tr}$(n) of signal characteristics, with the coefficients inserting a zero between respective iterations, i.e. as shown in FIG. 3.

Thereafter the interpolation step is repeated until the desired equivalent sampling frequency is achieved. For example, for an original sampling frequency of 100 kHz, the equivalent sampling frequency would be 200 kHz after one interpolation step, 400 kHz after two interpolation steps, 800 kHz after three interpolation steps, and 1.6 MHz after four interpolation steps.

Step (c) of the first embodiment of the invention, i.e. the step of identifying a fault wave signal 22 within the second data set i$_{trH}$(n), includes identifying when a signal characteristic within the second data set i$_{trH}$(n) exceeds a fault threshold 24. The fault threshold 24 is selected to be greater than a 5% value 26$_L$, 26$_R$ of a corresponding peak value signal characteristic 28$_L$, 28$_R$.

In addition, identifying when a signal characteristic within the second data set i$_{trH}$(n) exceeds a fault threshold 24 also includes establishing the time t$_L$, t$_R$ that the fault threshold 24 is exceeded, i.e. the time t$_L$, t$_R$ at which the fault wave signal 22 is received at the respective local or remote end 16, 18 of the phase lines 14A, 14B, 14C, as illustrated schematically with respect to the local end 16 in FIG. 4A, and in FIG. 4B with respect to the remote end 18.

Thereafter step (d) of utilising the propagation characteristics of the fault wave signal 22 to determine the origin of the fault wave signal 22 within the power transmission conduit 10, i.e. to determine the location of the fault 20, includes (a) carrying out steps (a) to (c) at each of the local end 16 and the remote end 18 of the transmission conduit 10 to thereby establish the respective time t$_L$, t$_R$ at which the corresponding fault threshold 24 is exceeded at a corresponding one of each of the said local and remote ends 16, 18; and thereafter determining the distance of the fault 20 from the local end 16 according to:

$$m = \frac{1}{2} * [L + (t_L - t_R) * v]$$

where,
(b) m is the distance of the fault 20 from the local end 16;
(c) L is the total length of the power transmission conduit 10; and
(d) v is the propagation velocity of the fault wave signal 22.

Other ways of utilising the propagation characteristics of the fault wave signal 22 to determine the origin of the fault wave signal 22 within the power transmission conduit 10, i.e. to determine the location of the fault 20, are also possible within the scope of the invention.

What we claim is:

1. A method of determining a fault location in a power transmission conduit, the method comprising:
   (a) sampling at an original sampling frequency a signal propagating through the power transmission conduit to establish a first data set including a plurality of sampled signal characteristics, wherein sampling at an original sampling frequency the signal includes applying a band pass filter to the signal or the first data set, and wherein a lower frequency of the band pass filter is between 2 kHz and 10 kHz and an upper frequency of the band pass filter is less than half of the original sampling frequency;
   (b) interpolating the first data set to establish a second data set including an increased number of signal characteristics whereby the second data set has a second sampling frequency more than five times higher than the original sampling frequency;
   (c) identifying a fault wave signal within the second data set, further comprising:
      identifying when a signal characteristic within the second data set exceeds a fault threshold, wherein the fault threshold is selected to be based at least in part on a percentage of a corresponding peak value signal characteristic; and
   (d) utilizing, after the fault wave signal is identified, the propagation characteristics of the fault wave signal to determine the origin of the fault wave signal within the power transmission conduit.

2. The method according to claim 1, wherein sampling at an original sampling frequency a signal propagating through the power transmission conduit includes filtering the first data set.

3. The method according to claim 1, wherein sampling at an original sampling frequency each of a respective phase signal propagating through a corresponding one of a plurality of phase conduits of a power transmission conduit configured to transfer power within a multi-phase power transmission network to establish a plurality of individual phase data sets including a plurality of sample phase signal characteristics, and thereafter converting the plurality of individual phase data sets into a single first data set indicative of the said individual phase data sets.

4. The method according to claim 3, wherein converting the plurality of individual phase data sets into a single first data set includes converting the phase data sets into a mode domain.

5. The method according to claim 4, wherein the manner in which conversion into the mode domain occurs relates to the nature of a fault arising with respect to one or more of the phase conduits.

6. The method according to claim 1, wherein identifying when a signal characteristic within the second data set exceeds a fault threshold includes establishing the time at which the fault threshold is exceeded.

7. The method according to claim 1, wherein utilizing, after the fault wave signal is identified, the propagation characteristics of the fault wave signal to determine the origin of the fault wave signal within the power transmission conduit includes:
   carrying out (a) to (c) at each of a local end of the transmission conduit and a remote end of the transmission conduit to thereby establish the respective time at which a corresponding fault threshold is exceeded at each of the said local and remote ends; and thereafter;
   determining the distance of the fault from the local end according to:

$$m = \frac{1}{2} * [L + (t_L - t_R) * v]$$

where,
   m is the distance of the fault from the local end;
   L is the total length of the power transmission conduit;
   $t_L$ is the time at which a fault threshold is exceeded at the local end;
   $t_R$ is the time at which a fault threshold is exceeded at the remote end; and
   v is the propagation velocity of the fault wave signal.

8. The method according to claim 1, wherein interpolating the first data set to establish a second data set including the increased number of signal characteristics further comprises:
   interpolating, at a first step, the first data set at the original sampling frequency;
   interpolating, at a second step subsequent to the first step, the first data set at a first intermediate frequency, wherein the first intermediate frequency is two times that of the original sampling frequency;
   interpolating, at a third step subsequent to the second step, the first data set at a second intermediate frequency, wherein the second intermediate frequency is two times that of the first intermediate frequency; and
   interpolating, at a fourth step subsequent to the third step, the first data set at the second sampling frequency, wherein the second sampling frequency is two times of the second intermediate frequency.

* * * * *